(12) United States Patent
Wu et al.

(10) Patent No.: US 10,810,402 B2
(45) Date of Patent: Oct. 20, 2020

(54) METHOD FOR FABRICATING FINGERPRINT IDENTIFICATION APPARATUS

(71) Applicant: SHENZHEN GOODIX TECHNOLOGY CO., LTD., Shenzhen (CN)

(72) Inventors: Baoquan Wu, Shenzhen (CN); Jian Shen, Shenzhen (CN); Wei Long, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 133 days.

(21) Appl. No.: 16/136,205

(22) Filed: Sep. 19, 2018

(65) Prior Publication Data

US 2019/0019009 A1 Jan. 17, 2019

Related U.S. Application Data

(63) Continuation of application No. PCT/CN2017/079542, filed on Apr. 6, 2017.

(51) Int. Cl.
*H01L 21/00* (2006.01)
*G06K 9/00* (2006.01)
*G02B 5/02* (2006.01)

(52) U.S. Cl.
CPC ....... *G06K 9/00087* (2013.01); *G02B 5/0278* (2013.01); *G06K 9/0004* (2013.01); *G06K 9/00013* (2013.01); *G06K 9/00053* (2013.01); *G06K 2009/0006* (2013.01)

(58) Field of Classification Search
CPC .......... G06K 9/00087; G06K 9/00013; G06K 9/0004; G06K 9/00053; G02B 5/0278
See application file for complete search history.

(56) References Cited

U.S. PATENT DOCUMENTS

| | | |
|---|---|---|
| 2004/0240713 A1 | 12/2004 | Hata |
| 2016/0254312 A1 | 9/2016 | Lee et al. |
| 2016/0328595 A1 | 11/2016 | Sun et al. |
| 2017/0017824 A1 | 1/2017 | Smith et al. |

FOREIGN PATENT DOCUMENTS

| | | |
|---|---|---|
| CN | 104036230 A | 9/2014 |
| CN | 105184222 A | 12/2015 |
| CN | 105205446 A | 12/2015 |
| CN | 106293180 A | 1/2017 |
| CN | 106503635 A | 3/2017 |
| EP | 3252655 A1 | 12/2017 |
| WO | 2016/119492 A1 | 8/2016 |

*Primary Examiner* — Richard A Booth (57) ABSTRACT

A fingerprint identification apparatus, a method for fabricating a cover and a terminal device are provided. A plurality of optical channels are arranged in the body of the cover, such that the light reflected by an object to be identified is as much as possible linearly transmitted to the photosensitive region in the image identification chip and the intensity of the light received by the image identification chip is maximized. This is favorable to form a clear image, and thus the precision of fingerprint identification of the fingerprint identification apparatus is improved. In addition, in the fingerprint identification apparatus, under the condition of satisfying the signal penetration rate, the cover may be as thick as possible, to further enhance the strength and reliability of the cover.

8 Claims, 7 Drawing Sheets

METHOD FOR FABRICATING FINGERPRINT IDENTIFICATION APPARATUS

CROSS-REFERENCE TO RELATED APPLICATIONS

The present application is a continuation of international application No. PCT/CN2017/079542 filed on Apr. 6, 2017, which is hereby incorporated by reference in its entirety.

TECHNICAL FIELD

The present disclosure relates to the technical field of fingerprint identification, and in particular, relates to a fingerprint identification apparatus, a method for fabricating a cover, and an electronic terminal.

BACKGROUND

In the field of fingerprint identification, signal penetration and thickness of covers need to be both considered. In one aspect, it is desired that a fingerprint identification apparatus has good signal penetration, that is, signals are capable of better penetrating to an identification region in the fingerprint identification apparatus to improve fingerprint identification rate of the fingerprint identification apparatus; in another aspect, it is desired that the cover is thicker, since thicker covers have a low cost and less manufacture loss but high strength and reliability.

Relative to a capacitive or ultrasonic fingerprint identification apparatus, in terms of consideration of both the penetration and the cover thickness, an optical fingerprint identification apparatus is more advantageous. A conventional optical fingerprint identification apparatus acquires fingerprint images by using the imaging theory of convex lens, and is mainly composed of a prism, a backlight panel and a convex lens. The light emitted by the backlight panel is transmitted through the prism (that is, the cover) to "valleys" of the fingerprint, and then totally reflected at the interface between the cover and air, and the light transmitted to "ridges" of the fingerprint diffuses. The light subjected to the total reflection is transmitted to the convex lens, and condensed on a photoelectric sensor via the convex lens to acquire the fingerprint images.

As known from the above description, in the optical fingerprint identification apparatus based on the convex lens imaging theory, the light reflected by a finger or the like passes through the convex lens and aggregated on the photoelectric sensor to acquire the fingerprint images. The convex lens only condenses the horizontally incident light. Apparently, it is hard to ensure that the light reflected by the finger or the like is mostly horizontally incident on the convex lens. As a result, the intensity of the light that is reflected by the finger or the like and hence transmitted to the photoelectric sensor is affected to some extent.

SUMMARY

Embodiments of the present disclosure provide a fingerprint identification apparatus and a method for fabrication a cover thereof, and an electronic terminal.

A first aspect of the present disclosure provides a fingerprint identification apparatus. The fingerprint identification apparatus includes: an image identification chip and a cover, wherein the cover is arranged over the image identification chip, and the cover includes a body and a plurality of optical channels; wherein the plurality of optical channels are configured to linearly transmit light reflected by an object to be identified to a photosensitive region in the image identification chip to form a biological feature image of the object.

Optionally, a central line of the plurality of optical channels is parallel to a longitudinal central line of the photosensitive region in the image identification chip.

Optionally, a direction of a predefined included angle formed between a central line of the plurality of optical channels and a longitudinal central line of the photosensitive region in the image identification chip is arranged in the body.

Optionally, an inner wall of all or part of the plurality of optical channels has a predefined topography configured to diffuse light transmitted to the inner wall, such that the light transmitted to the photosensitive region in the image identification chip is light that is reflected by the object and linearly transmitted along the plurality of optical channels.

Optionally, the predefined topography is a porous rough surface.

Optionally, a first light processing layer is arranged on an inner wall of each of all or a part of the plurality of optical channels; wherein the first light processing layer is configured to enable the light transmitted to the photosensitive region in the image identification chip to be light that is reflected by the object and linearly transmitted along the plurality of optical channels.

Optionally, the first light processing layer is a first light absorbing layer, the first light absorbing layer being configured to absorb the light transmitted to the inner wall; or the first light processing layer is a first light blocking layer, the first light blocking layer being configured to block the light transmitted to the inner wall.

Optionally, a second light processing layer is arranged on an upper surface of the body; wherein the second light processing layer is configured to enable the light transmitted to the photosensitive region in the image identification chip to be light that is reflected by the object and linearly transmitted along the plurality of optical channels.

Optionally, the second light processing layer is a second light absorbing layer, the second light absorbing layer being configured to absorb light transmitted to the upper surface; or the second light processing layer is a second light blocking layer, the second light blocking layer being configured to block the light transmitted to the upper surface.

Optionally, a third light processing layer is arranged on a lower surface of the body; wherein the third light processing layer is configured to enable the light transmitted to the photosensitive region in the image identification chip to be light that is reflected by the object and linearly transmitted along the plurality of optical channels.

Optionally, the third light processing layer is a third light absorbing layer, the third light absorbing layer being configured to absorb light transmitted to the lower surface; or the third light processing layer is a third light blocking layer, the third light blocking layer being configured to block the light transmitted to the lower surface.

Optionally, all or part of the plurality of optical channels are through holes.

Optionally, the through hole has a diameter between 10 μm and 90 μm.

Optionally, a light transmitting film layer is arranged over the body, such that all or part of the plurality of optical channels are cavities.

Optionally, the cavities have a diameter between 10 μm and 90 μm.

Optionally, the image identification chip is attached to the cover.

Optionally, a bonding layer is coated on an installation surface of the image identification chip, and a lower surface of the cover is bonded to the installation surface of the image identification chip via a bonding layer.

Optionally, the bonding layer has a hollow structure; wherein a hollow hole of the hollow structure is opposite to the optical channel and opposite to the photosensitive region in the image identification chip.

A second aspect of the present disclosure provides a method for fabricating a cover of a fingerprint identification apparatus. The method includes: treating one surface of the body such that a plurality of groove structures are formed on the body; and treating the other surface of the body such that the plurality of groove structures formed on the body are transformed into the optical channels; wherein the plurality of optical channels are configured to directly transmit light reflected by an identified object to a photosensitive region in the image identification chip to form a biological feature image of the object.

Optionally, the treating one surface of the body such that a plurality of groove structures are formed on the body includes: treating one surface of the body by an etching, laser or mechanical drilling process such that the plurality of groove structures are formed on the body.

Optionally, prior to the treating one surface of the body and upon treating the other surface of the body, the method further includes: performing surface treatment for an inner wall of each of all or part of the groove structures in the plurality of optical channels to form a predefined topography; wherein the inner wall having the predefined topography is configured to diffuse light transmitted to the inner wall, such that the light transmitted to the photosensitive region in the image identification chip is light that is reflected by the object and linearly transmitted along the plurality of optical channels.

Optionally, prior to the treating one surface of the body and upon treating the other surface of the body, the method further includes: performing surface treatment for an inner wall of all or part of the groove structures in the plurality of optical channels to form a first light processing layer; wherein the first light processing layer is configured to enable the light transmitted to the photosensitive region in the image identification chip to be light that is reflected by the object and linearly transmitted along the plurality of optical channels.

Optionally, the method further includes: forming a second light processing layer on the one surface of the body where the groove structures are formed by a coating covering process; wherein the second light processing layer is configured to enable the light transmitted to the photosensitive region in the image identification chip to be light that is reflected by the object and linearly transmitted along the plurality of optical channels.

Optionally, the method further includes: forming a third light processing layer on the other surface of the body where the optical channels are formed by a coating covering process; wherein the third light processing layer is configured to enable the light transmitted to the photosensitive region in the image identification chip to be light that is reflected by the object and linearly transmitted along the plurality of optical channels.

Optionally, the treating the other surface of the body such that the plurality of groove structures formed on the body are transformed into the optical channels includes: treating the other surface of the body by a grinding and thickness-reducing process such that the plurality of groove structures formed on the body are transformed into the optical channels.

A third aspect of the present disclosure provides an electronic terminal. The electronic terminal includes the above described fingerprint identification apparatus.

In the fingerprint identification apparatus, the method for fabricating a cover, and the terminal device according to embodiments of the present disclosure, a plurality of optical channels are arranged in the body of the cover, such that the light reflected by an identified object is as much as possible linearly transmitted to the photosensitive region in the image identification chip and the intensity of the light received by the image identification chip is maximized. This is favorable to forming a clear image, and thus the precision of fingerprint identification of the fingerprint identification apparatus is improved. In addition, in the fingerprint identification apparatus according to embodiments of the present disclosure, under the condition of satisfying the signal penetration rate, the cover may be as thick as possible, to further enhance the strength and reliability of the cover.

BRIEF DESCRIPTION OF THE DRAWINGS

To more clearly describe technical solutions according to the embodiments of the present application or in the prior art, drawings that are to be referred for description of the embodiments or the prior art are briefly described hereinafter. Apparently, the drawings described hereinafter merely illustrate some embodiments of the present application. Persons of ordinary skill in the art may also derive other drawings based on the drawings described herein without any creative effort.

DETAILED DESCRIPTION

To make the objectives, technical features, and advantages of the present application clearer and more understandable, the technical solutions according to the embodiments of the present application are further described in detail with reference to the accompany drawings. Apparently, the embodiments described herein are merely some exemplary ones, rather than all the embodiments of the present application. Based on the embodiments of the present application, all other embodiments derived by persons of ordinary skill in the art without any creative efforts shall fall within the protection scope of the present application.

As illustrated in FIG. 1a, FIG. 1b, FIG. 1c and FIG. 2, a fingerprint identification apparatus according to one embodiment of the present disclosure includes: an image identification chip 7 and a cover, wherein the cover is arranged over the image identification chip 7, and the cover includes a body 1 and a plurality of optical channels 2 arranged in the body 1; wherein the plurality of optical channels 2 are configured to linearly transmit light reflected by an identified object to a photosensitive region in the image identification chip 7 to form a biological feature image of the object.

Figure 1A:
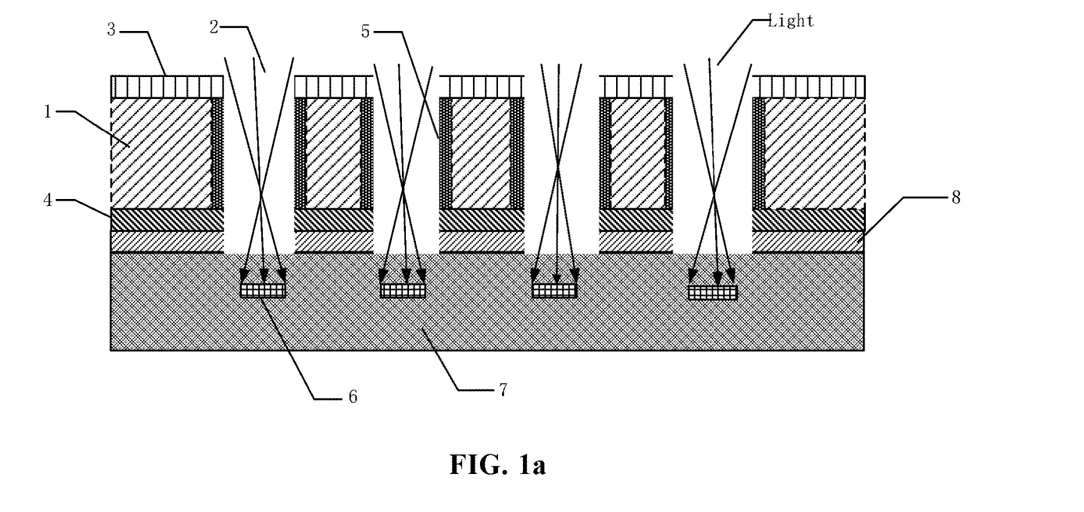
FIG. 1a is a schematic structural diagram of a fingerprint identification apparatus according to one embodiment of the present disclosure.
Figure 1B:
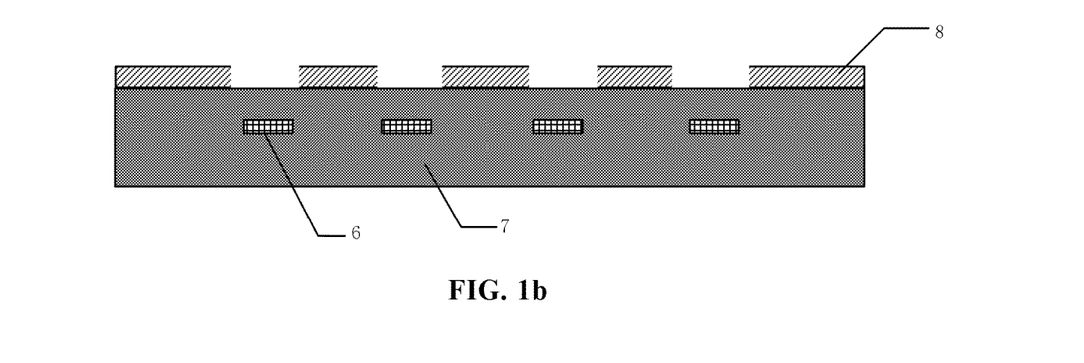
FIG. 1b is a schematic structural diagram of an image identification chip in the fingerprint identification apparatus according to one embodiment of the present disclosure.
Figure 1C:
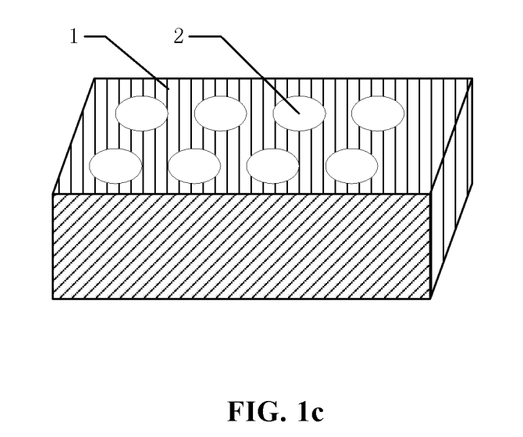
FIG. 1c is a schematic structural view of a cover according to one embodiment of the present disclosure.
Figure 2:
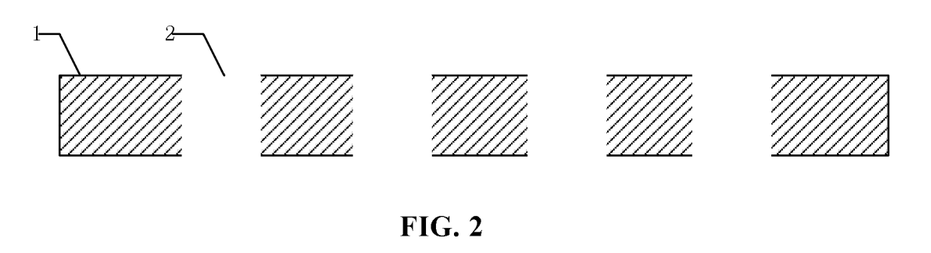
FIG. 2 is a schematic structural view of a cross section of the cover according to one embodiment of the present disclosure.

Optionally, the cover is bonded to the image identification chip 7. For example, a bonding layer 8 is coated on an installation surface of the image identification chip 7, and a lower surface of the cover is bonded to the installation surface of the image identification chip 7 via a bonding layer 8. It should be noted that the bonding layer 8 has a good optical feature, and thus the intensity of the light reflected by the object that is transmitted to the photosensitive region in the image identification chip 7 via the optical channel 2 is not affected. Optionally, the bonding layer 8 is an adhesive layer formed by coating an optical adhesive.

Further, to maximize the intensity of the light that is transmitted to the photosensitive region in the image identification chip, that is, to improve the transmittance of the optical signal, the embodiments of the present disclosure give further restrictions on the bonding layer.

Specifically, the bonding layer 8 on the image identification chip is formed to have a hollow structure. The hollow structure may be formed by exposure adhesive removal and the like process. When the cover is assembled on the image identification chip 7, the hollow holes in the hollow structure, the optical channels 2 of the cover, the photosensitive region in the image identification chip 7 pass through each other. That is, the hollow holes in the hollow structure are right opposite to the optical channels 2 of the cover and meanwhile right opposite to the photosensitive region in the image identification chip 7. According to the embodiment of the present disclosure, the intensity of the light transmitted to the photosensitive region in the image identification chip is maximized by designing the bonding layer 8 to be a hollow structure.

In the embodiments of the present disclosure hereinafter, description is given by using the object as a finger, the biological feature image of the object is a fingerprint image. It should be noted that the object is not limited to the finger, which may also be a palm, and the corresponding biological feature image may also be a palmprint image, which is not described herein any further.

Specifically, in one aspect, the cover according to this embodiment is configured to receive touches of the finger, palm and the like identified object; and in another aspect, the optical channel 2 in the cover is configured to linearly transmit the light reflected by the object to the photosensitive region in the image identification chip 7. For example, the cover according to this embodiment may be made from any one of monocrystalline silicon, polycrystalline silicon, glass, sapphire glass and ceramic. The thickness of the cover according to this embodiment of the present disclosure may be several hundreds of microns.

It should be noted that the object may be in direct touch with the cover, or may be in approximate touch with the cover. The direct contact is, for example, placing the object to the surface of the cover, and the approximate contact is, for example, placing the object within a predetermined range approximate to the cover, but is not limited thereto, as long as the light reflected by the object is capable of entering the optical channel 2 such that the light is transmitted to the photosensitive region in the image identification chip 7.

In this embodiment, a light source is configured to provide light that may be reflected by the object and then transmitted to the photosensitive region in the image identification chip 7. For example, the light source may be a light-emitting diode (LED) lamp. The light source may be specifically arranged in the fingerprint identification apparatus, or may be a light source in an organic light-emitting diode (OLED) display screen. The specific position may be defined according to the position of the cover in the fingerprint identification apparatus, as long as the light emitted by the light source is reflected by the object on the cover to form light that may be transmitted through the optical channel 2.

In this embodiment, the optical channel 2 of the cover may be arranged with reference to the photosensitive region in the image identification chip 7 in the fingerprint identification apparatus, as long as the light entering the optical channel reaches the photosensitive region in the image identification chip 7. For example, the optical channel 2 may be of a circular shape, a square shape or another regular shape. For example, the optical channel 2 may be a straight hole, a square hole, a horn hole, a conical hole or the like, which is not limited in the embodiment of the present disclosure.

It should be noted that in this embodiment, the image identification chip 7 may be a chip having a photoelectric conversion function, for example, an image identification chip 7 integrated with a charge coupled device (CCD), a complementary metal-oxide semiconductor (CMOS) and the like image sensor, which is however not limited hereto. The photosensitive region in the image identification chip 7 may be specifically a region having the photoelectric conversion function in the image identification chip 7. In an image identification chip 7 integrated with a CCD image sensor as an example, the photosensitive region is provided with a pixel-sensitive unit array. The pixel-sensitive unit array is formed by photoelectric diodes. One photoelectric diode corresponds to one pixel-sensitive unit. Upon receiving an optical signal, the photoelectric diode acting as the pixel-sensitive unit may convert the optical signal to the electrical signal, and output the electrical signal to the other functional units in the image identification chip 7 for analysis and identification to acquire a fingerprint image.

Figure 3A:
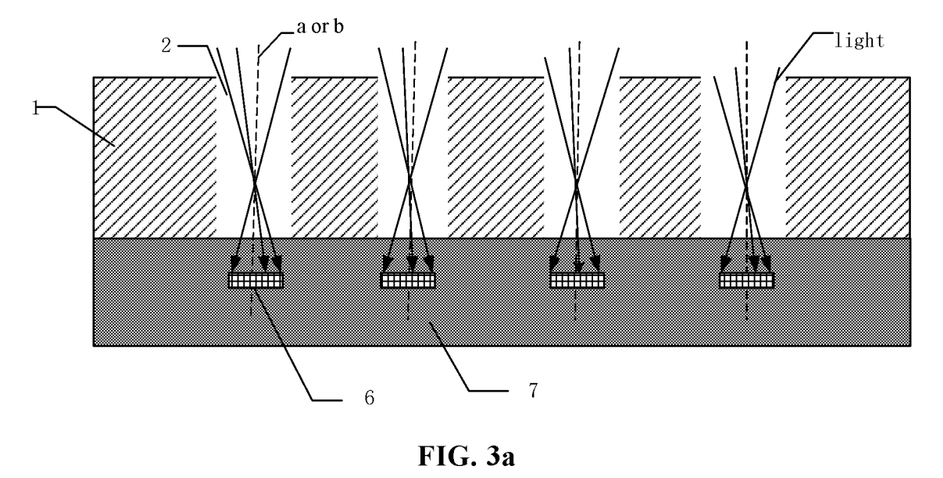
FIG. 3a is a schematic structural diagram of exemplarily transmitting light from a cover to a photosensitive region in an image identification chip according to one embodiment of the present disclosure.
Figure 3B:
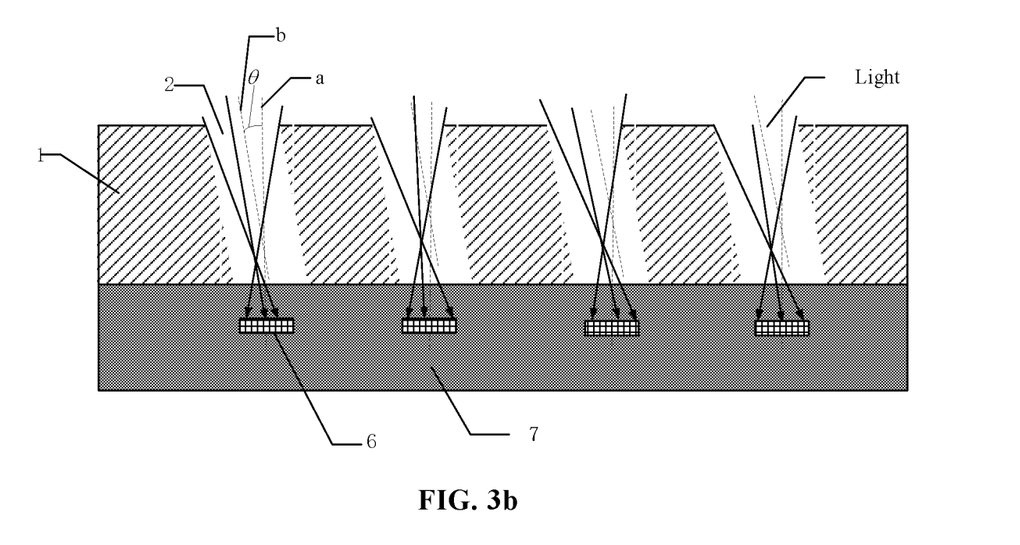
FIG. 3b is another schematic structural diagram of exemplarily transmitting light from a cover to a photosensitive region in an image identification chip according to one embodiment of the present disclosure.

In this embodiment, the optical channel 2 may act as an imaging hole, such that an object on the side of the object may be formed on the side of the photosensitive region in the image identification chip 7. Referring to FIG. 3a or FIG. 3b, using the case where the object is a finger as an example, when the finger touches the cover and when light emitted by the light source reaches the finger, the light is reflected by the finger to form reflected light. Since the body 1 of the cover in this embodiment is provided with a plurality of optical channels 2, the reflected light is linearly transmitted to the photosensitive region in the image identification chip 7 along the optical channels 2, and photosensitive units in the photosensitive region receive the light reflected by the finger and perform photoelectric signal conversion to form a fingerprint image.

In this embodiment, since the cover may plane the path for light transmission along the optical channels 2, the restriction on the thickness of a capacitive fingerprint identification sensor may be broken through. Under the condition of satisfying the signal penetration rate, he cover may be as thick as possible, to further enhance the strength and reliability of the cover.

In this embodiment, if the pixel-sensitive units and the like photosensitive units are distributed in the photosensitive region in the image identification chip 7 in the form of a matrix array, correspondingly, the plurality of optical channels 2 in the cover are also arranged in the body in the form of a matrix structure, such that more reflected light from the object may be transmitted to the photosensitive region in the image identification chip 7. In this way, the intensity of the light received in the photosensitive region is as great as possible, which is favorable to forming a clear image, such that the identification precision of the fingerprint identification apparatus is improved. The distribution density of the plurality of optical channels 2 may be flexibly adjusted according to the actual needs, which is not specifically defined herein.

Optionally, all of the optical channels 2 or part of the optical channels 2 in the plurality of optical channels 2 are through holes. For example, in this embodiment, all of the optical channels 2 are through holes of the body 1 penetrating the cover. Optionally, the through hole has a diameter between 10 µm and 90 µm, inclusive.

Alternatively, a light transmitting film layer may also be arranged over the body 1, such that all of the optical channels 2 or part of the optical channels 2 in the plurality of optical channels 2 are cavities. It should be noted that the cavity configuration is intended to enable the cover to have a dust-proof and water-proof function to prevent dusts or moisture and the like from entering the fingerprint identification apparatus along the optical channels 2 and hence lowering the life type and fingerprint identification accuracy and the like of the fingerprint identification apparatus. Optionally, the cavities have a diameter between 10 µm and 90 µm, inclusive.

It should be noted that in this embodiment, the spacing and diameter of the optical channels 2 may be determined according to the actual needs, which are not specifically defined in the embodiments of the present disclosure.

In one possible implementation, the plurality of optical channels 2 are arranged in the body 1, and a central line b of the plurality of optical channels 2 is parallel to a longitudinal central line of the photosensitive region in the image identification chip 7.

Specifically, referring to FIG. 3a, in the image identification chip 7 according to the embodiment of the present disclosure, the central line of the plurality of optical channels arranged in the body 1 of the cover is parallel to the longitudinal central line a of the photosensitive region in the image identification chip 7, such that the light reflected by the object may be as much as possible linearly transmitted to the photosensitive region in the image identification chip 7 along the optical channels 2. In this way, the intensity of the light received by the image identification chip 7 is improved, and the identification precision of the fingerprint identification apparatus is further improved.

Optionally, the central line of the plurality of optical channels 2 arranged in the body of the cover is parallel to the longitudinal central line a, such that the cover may be conveniently assembled into the fingerprint identification apparatus. It should be noted that the central line b of the plurality of optical channels 2 arranged in the body 1 of the cover is not only parallel to the longitudinal central line of the cover, but also parallel to the longitudinal central line a of the photosensitive region in the image identification chip 7, that is, the cover may be assembled on the fingerprint identification apparatus in a flat deployment form. In this way, the entire fingerprint identification apparatus may be small-sized as much as possible.

In another possible implementation, a direction of a predefined included angle θ formed between the central line b of the plurality of optical channels 2 and a longitudinal central line a of the photosensitive region in the image identification chip 7 is arranged in the body 1.

Specifically, referring to FIG. 3b, according to the embodiment of the present disclosure, the direction of the predefined included angle θ formed between the central line b of the plurality of optical channels 2 and the longitudinal central line a of the photosensitive region in the image identification chip 7 is arranged in the body. The value of the predefined included angle θ is not limited, as long as it is ensured that the light reflected by the object is linearly transmitted to the photosensitive region in the image identification chip 7 along the optical channels 2.

In the fingerprint identification apparatus according to this embodiment, a plurality of optical channels 2 are arranged in the body 1 of the cover, such that the light reflected by an identified object is as much as possible linearly transmitted to the photosensitive region in the image identification chip 7 and the intensity of the light received by the image identification chip 7 is maximized. This is favorable to forming a clear image, and thus the precision of fingerprint identification of the fingerprint identification apparatus is improved. In addition, in the fingerprint identification apparatus according to embodiments of the present disclosure, under the condition of satisfying the signal penetration rate, the cover may be as thick as possible, to further enhance the strength and reliability of the cover.

Figure 4:
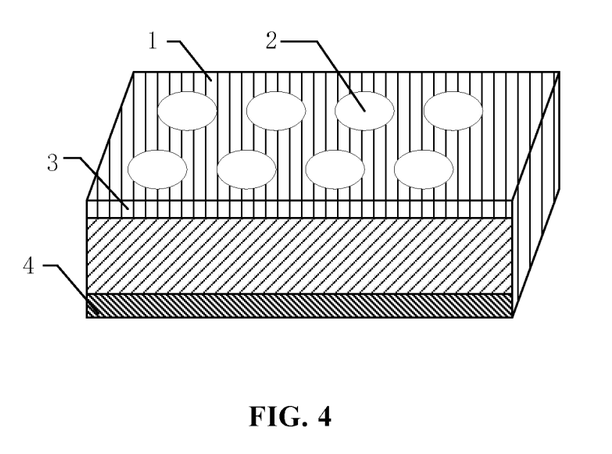
FIG. 4 is a schematic structural view of a cover according to another embodiment of the present disclosure.
Figure 5:
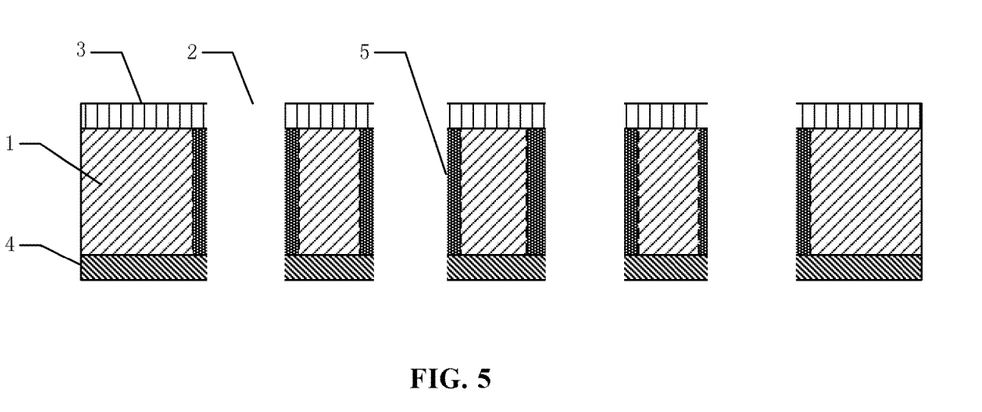
FIG. 5 is a schematic structural view of a cross section of the cover according to another embodiment of the present disclosure.
Figure 6A:
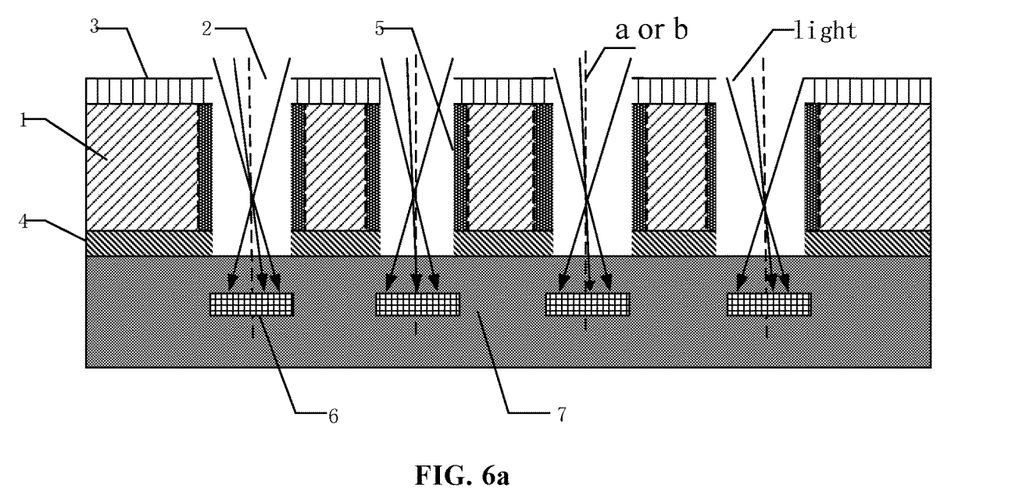
FIG. 6a is stiller another schematic structural diagram of exemplarily transmitting light from a cover to a photosensitive region in an image identification chip according to one embodiment of the present disclosure.

FIG. 4 is a schematic structural view of a cover according to another embodiment of the present disclosure. FIG. 5 is a schematic structural view of a cross section of the cover according to another embodiment of the present disclosure; FIG. 6a is stiller another schematic structural diagram of exemplarily transmitting light from a cover to a photosensitive region in an image identification chip according to one embodiment of the present disclosure. FIG. 3a is yet still another schematic structural diagram of exemplarily transmitting light from a cover to a photosensitive region in an image identification chip according to one embodiment of the present disclosure. This embodiment of the present disclosure provides optimized description for the above embodiment. Specifically, the optical channels 2 of the cover and the surface of the cover are further described.

Since the cover has some optical features, the light transmitted to the photosensitive region in the image identification chip 7 may be possibly subject to some interference light while the light is reflected by the object and linearly transmitted along the plurality of optical channels. The interference light may be incident from the upper surface or lower surface of the cover and reach the cover, hence penetrate through the cover to reach the optical channels 2, and then be transmitted to the photosensitive region in the image identification chip 7, or directly penetrates through the cover to the photosensitive region in the image identification chip 7, thereby affecting the identification precision of the fingerprint identification apparatus. In addition, if the light transmitted to the inner walls of the optical channels 2 are not treated, interference light may also be formed. Accordingly, in this embodiment, the surfaces of the optical channels 2 and the cover are further modified to prevent as much as possible the interference light from entering the photosensitive region in the image identification chip 7.

Specifically, in this embodiment, to enable the light transmitted to the photosensitive region in the image identification chip 7 to be light that is reflected by the object and linearly transmitted along the plurality of optical channels 2, surface treatment is performed for the inner walls of the optical channels 2 to prevent as much as possible the interference light from different directions from being transmitted to the optical channels 2 via the inner walls of the optical channels 2, to ensure that the light transmitted to the photosensitive region in the image identification chip 7 is the light that is reflected by the object and linearly transmitted along the plurality of optical channels 2.

In one possible implementation, an inner wall of each of all or part of the optical channels 2 has a predefined topography configured to diffuse light transmitted to the inner wall. The inner wall having the predefined topography is configured to diffuse light transmitted to the inner wall, such that the light transmitted to the photosensitive region in the image identification chip 7 is light that is reflected by the object and linearly transmitted along the plurality of optical channels 2. Preferably, the predefined topography is a porous rough surface. It should be noted that the porous rough surface is capable of further causing the light transmitted to the inner wall to diffuse towards various directions out of order, such that the interference light from different directions is prevented from being transmitted to the photosensitive region in the image identification chip 7 via the inner walls of the optical channels 2.

In another possible implementation, a first light processing layer 5 is arranged on an inner wall of each of all the optical channels 2 or part of the optical channels 2 in the plurality of optical channels 2; wherein the first light processing layer 5 is configured to enable the light transmitted onto the photosensitive region in the image identification chip 7 to be light that is reflected by the object and linearly transmitted along the plurality of optical channels 2.

Specifically, in one possible implementation, the first light processing layer 5 may be a first light absorbing layer, wherein the first light absorbing layer is configured to absorb the light transmitted to the inner wall. In this implementation, a first light absorbing layer is arranged to absorb the interference light transmitted to the inner walls of the optical channels 2, to prevent as much as possible the interference light from being transmitted to the photosensitive region in the image identification chip 7.

Specifically, in another possible implementation, the first light processing layer 5 may be a first blocking layer, wherein the first light blocking layer is configured to block the light transmitted to the inner wall. It should be noted that the light blocking refers to block the interference light from entering the photosensitive region in the image identification chip 7 in addition to the light absorption. For example, the first light blocking layer is a coating having a light total reflection function, and the interference light is reflected away when being transmitted to the coating; or the first light blocking layer is a coating coated with micro particles, and the interference light is reflected away when being transmitted to the coating. Nevertheless, the blocking process is not limited to the above listed examples. The principles of light blocking by a second light blocking layer and by a third light blocking layer involved hereinafter may be referenced to the principles of the light blocking by the first light blocking layer, which are thus not described herein any further.

Optionally, in this embodiment, surface treatment is performed for the upper surface of the cover to modify the surface features thereof, to prevent as much as possible the interference light from different directions from being transmitted to the optical channels 2.

Specifically, a second light processing layer 3 is arranged on an upper surface of the body 1; wherein the second light processing layer 3 is configured to enable the light transmitted onto the photosensitive region in the image identification chip 7 to be light that is reflected by the object and linearly transmitted along the plurality of optical channels 2. Optionally, on the upper surface of the cover, a region out of the region right opposite to the optical channels is covered by the second light processing layer 3, to prevent as much as possible the interference light from different directions from being transmitted to the optical channels 2 via the upper surface of the cover.

In one possible implementation, the second light processing layer 3 may be a second light absorbing layer, wherein the second light absorbing layer is configured to absorb the light transmitted to the upper surface. It should be noted that the interference light may penetrate through the upper surface of the cover and reach the cover, hence penetrate through the cover to reach the optical channels 2, and then be transmitted to the photosensitive region in the image identification chip 7, or directly penetrates through the cover to the photosensitive region in the image identification chip 7, thereby affecting the identification precision of the fingerprint identification apparatus. To prevent as much as possible the interference light from being transmitted to the photosensitive region in the image identification chip 7, in this embodiment, a second light absorbing layer is arranged on the upper surface of the body 1 to absorb the interference light transmitted to the upper surface of the body 1.

In another possible implementation, the second light processing layer 3 may be a second light blocking layer, wherein the second light blocking layer is configured to block the light transmitted to the upper surface. It should be noted that the interference light may penetrate through the upper surface of the cover and reach the cover, hence penetrate through the cover to reach the optical channels 2, and then be transmitted to the photosensitive region in the image identification chip 7, or directly penetrates through the cover to the photosensitive region in the image identification chip 7, thereby affecting the identification precision of the fingerprint identification apparatus. To prevent as much as possible the interference light from being transmitted to the photosensitive region in the image identification chip 7, in this embodiment, a second light blocking layer is arranged on the upper surface of the body 1 to block the interference light transmitted to the photosensitive region in the image identification chip 7 via the upper surface of the body 1.

Optionally, to enable the light transmitted to the image identification chip 7 to be the light that is reflected by the object and linearly transmitted along the plurality of optical channels 2, in this embodiment, the lower surface of the cover is treated to modify the surface features thereof, to prevent as much as possible the interference light from different directions from being transmitted to the optical channels 2 via the lower surface of the cover. This further ensures that the light transmitted to the photosensitive region in the image identification chip 7 is the light that is reflected by the object and linearly transmitted along the plurality of optical channels 2.

Specifically, a third light processing layer 4 is arranged on the upper surface of the body 1; wherein the third light processing layer 4 is configured to enable the light transmitted onto the photosensitive region in the image identification chip 7 to be light that is reflected by the object and linearly transmitted along the plurality of optical channels 2. Preferably, on the lower surface of the cover, a region out of the region right opposite to the optical channels is covered by the third light processing layer 4, to prevent as much as possible the interference light from different directions from being transmitted to the optical channels 2 via the lower surface of the cover.

In one possible implementation, the third light processing layer 4 may be a third light absorbing layer, wherein the third light absorbing layer is configured to absorb the light transmitted to the lower surface. It should be noted that the interference light may penetrate through the lower surface of the cover and reach the cover, hence penetrate through the cover to reach the optical channels 2, and then be transmitted to the photosensitive region in the image identification chip 7, or directly penetrates through the cover to the photosensitive region in the image identification chip 7, thereby affecting the identification precision of the fingerprint identification apparatus. To prevent as much as possible the interference light from being transmitted to the photosensitive region in the image identification chip 7, in this embodiment, a third light absorbing layer is arranged on the lower surface of the body 1 to absorb the interference light transmitted to the lower surface of the body 1.

In another possible implementation, the third light processing layer 4 may be a third light blocking layer, wherein the third light blocking layer is configured to block the light transmitted to the lower surface. It should be noted that the interference light may penetrate through the lower surface of the cover and reach the cover, hence penetrate through the cover to reach the optical channels 2, and then be transmitted to the photosensitive region in the image identification chip 7, or directly penetrates through the cover to the photosensitive region in the image identification chip 7, thereby affecting the identification precision of the fingerprint identification apparatus. To prevent as much as possible the interference light from being transmitted to the photosensitive region in the image identification chip 7, in this embodiment, a third light blocking layer is arranged on the lower surface of the body 1 to block the interference light transmitted to the photosensitive region in the image identification chip 7 via the upper surface of the body 1.

It should be noted that to enable the light transmitted to the photosensitive region in the image identification chip 7 to be the light that is reflected by the object and linearly transmitted along the plurality of optical channels 2, surface treatment is performed for one or more of the inner walls of the optical channels, the upper surface of the cover, and the lower surface of the cover to modify the surface features thereof. Nevertheless, the surface treatment method for modifying the surface feature is not limited to the above listed examples in this embodiment of the present disclosure.

It should be noted that the first light processing layer 5, the second light processing layer 3 and the third light processing layer 4 are all light absorbing layer made from opaque materials. The absorbing layer has a thickness between 1 μm and 10 μm, inclusive. For example, the first light processing layer 5, the second light processing layer 3 and the third light processing layer 4 are all light absorbing layers made from nano composite light absorbing materials, or the first light processing layer 5, the second light processing layer 3 and the third light processing layer 4 are absorbing layers made from deep-color materials.

It should be noted that if the first light processing layer 5, the second light processing layer 3 and the third light processing layer 4 are all light blocking layer made from opaque materials. The light blocking layer has a thickness between 1 μm and 10 μm, inclusive. For example, the first light processing layer 5, the second light processing layer 3 and the third light processing layer 4 are any one of a black adhesive layer, a metal layer and a non-metal layer; wherein the metal layer includes one of or any combination of aluminum, aluminum nitride, titanium, titanium nitride, tantalum, tantalum nitride, tungsten, titanium-tungsten alloy, silver and gold; and the non-metal layer includes one of or any combination of silicon oxide, silicon nitride, silicon oxynitride and silicon carbide, which are not limited hereto.

Figure 6B:
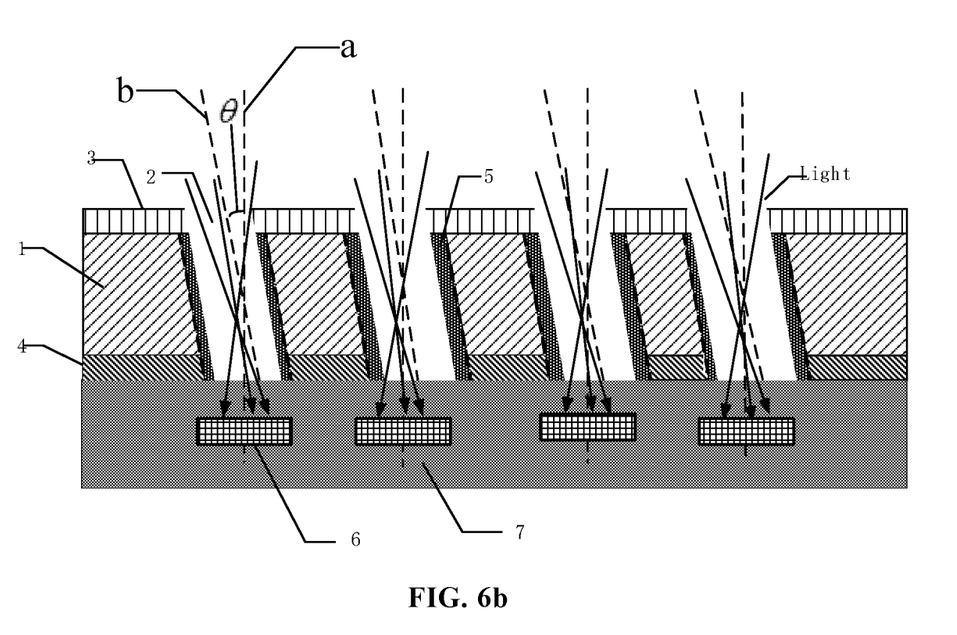
FIG. 6b is yet still another schematic structural diagram of exemplarily transmitting light from a cover to a photosensitive region in an image identification chip according to one embodiment of the present disclosure.

In this embodiment, the optical channel 2 may act as an imaging hole, such that an object on the side of the object may be formed on the side of the photosensitive region in the image identification chip 7. Referring to FIG. 6a or FIG. 6b, using the case where the object is a finger as an example, when the finger touches the cover and when light emitted by the light source reaches the finger, the light is reflected by the finger to form reflected light. Since the body 1 of the cover in this embodiment is provided with a plurality of optical channels 2, the reflected light is linearly transmitted to the photosensitive region in the image identification chip 7 via the optical channels 2, and photosensitive units in the photosensitive region receive the light reflected by the finger and perform photoelectric signal conversion to form a fingerprint image. During the process in which the reflected light is linearly transmitted to the photosensitive region in the image identification chip 7 along the optical channels 2, if interference light is transmitted to the inner walls of the optical channels 2, the interference light may diffuse on the inner walls of the optical channels 2 or may be absorbed or blocked by the first light processing layer 5 on the inner walls of the optical channels 2, to prevent the interference light from being transmitted to the optical channels 2 via the inner walls of the optical channels 2; and during the process in which the reflected light is transmitted to the photosensitive region in the image identification chip 7, if interference light is transmitted to the upper surface or lower surface of the cover, correspondingly the interference light is absorbed or blocked by the second light processing layer 3 arranged on the upper surface or the third light processing layer arranged on the lower surface, to prevent the interference light from being transmitted to the photosensitive region in the image identification chip 7 via the surface of the cover.

Figure 7:
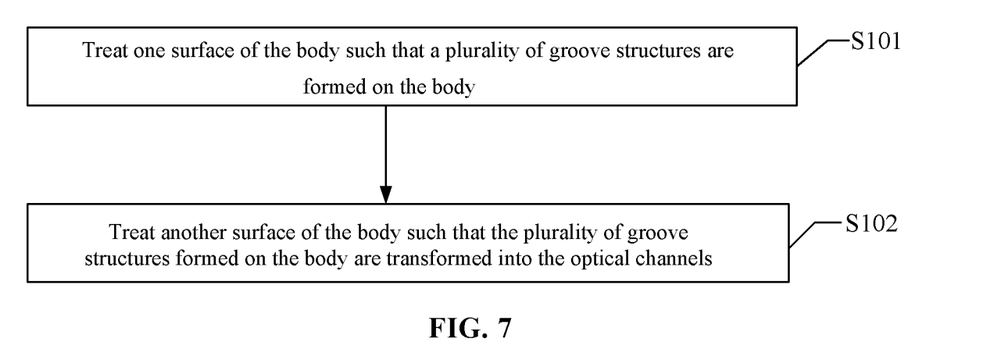
FIG. 7 is a flowchart of a method for fabricating a cover according to one embodiment of the present disclosure.

FIG. 7 is a flowchart of a method for fabricating a cover according to one embodiment of the present disclosure. The method for fabricating a cover according to this embodiment of the present disclosure is used for fabricating the cover according to the above embodiment. As illustrated in FIG. 7, the method for fabricating a cover according to this embodiment of the present disclosure includes the following steps:

Step S101: One surface of the body 1 is treated such that a plurality of groove structures are formed on the body 1.

Specifically, one surface of the body 1 is treated by an etching, laser or mechanical drilling process such that the plurality of groove structures are formed on the body 1. However, the formation of the groove structures is not limited hereto.

For example, in the present disclosure, the thickness of the cover may be several hundreds of microns, one surface, for example, an upper surface of the body 1 of the cover is fabricated by virtue of etching, laser or mechanical drilling, to form the plurality of groove structures on the body 1 of the cover. These groove structures may be blind holes. The size and spacing of the blind hole are determined according to the fabrication process or design needs.

Figure 9:
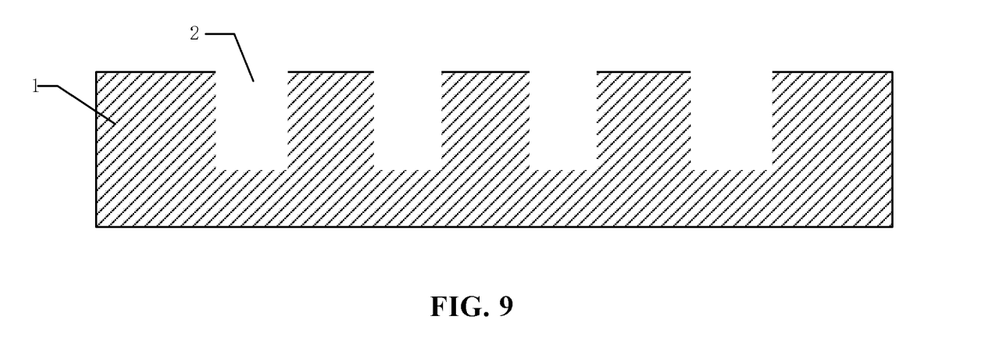
FIG. 9 is a schematic structural view of an exemplary cover according to an embodiment of the present disclosure.

FIG. 9 is a schematic structural view of a semi-finished product of an exemplary cover according to an embodiment of the present disclosure. Upon the fabrication process in step S101, the structure of the cover is as illustrated in FIG. 9. In the embodiment of the present disclosure, one surface, for example, an upper surface of the body 1 of the cover is fabricated by virtue of etching, laser or mechanical drilling, to form the plurality of groove structures on the body 1 of the cover. These groove structures may be blind holes. The size and spacing of the blind hole are determined according to the fabrication process or design needs.

Step S102: The other surface of the body 1 is treated such that the plurality of groove structures formed on the body 1 are transformed into the optical channels 2. The plurality of optical channels are configured to directly transmit light reflected by an identified object to a photosensitive region in the image identification chip to form a biological feature image of the object.

Specifically, the other surface of the body is treated by a grinding and thickness-reducing process such that the plurality of groove structures formed on the body 1 are transformed into the optical channels 2, which is not limited hereinto.

For example, if the groove structures are fabricated from the upper surface to the lower surface of the body 1 of the cover, the lower surface of the body 1 of the cover is ground and thinned such that the plurality of groove structures are transformed into the optical channels 2.

It should be noted that in this embodiment, the one surface or the other surface of the body 1 may also be treated by virtue of etching, laser or mechanical drilling, such that the optical channels 2 are directly formed on the body, that is, during the fabrication, the cover is made to directly penetrate through to form the optical channels 2.

It should be noted that the method for fabricating a cover according to the embodiment of the present disclosure may also be referenced to the relevant content of the cover according to the above embodiments, which is not described herein any further.

In the method for fabricating a cover according to this embodiment, a plurality of groove structures may be formed on the body 1 of the cover by virtue of a plurality of optional processes and techniques, and the plurality of groove structures may be transformed into the optical channels 2; in addition, the optical channels 2 may be simply and quickly formed on the cover, such that the cover has the function of transmitting the light reflected by the object towards the photosensitive region in the image identification chip 7 to the photosensitive region in the image identification chip 7. The method for fabricating a cover according to the embodiment of the present disclosure is simple and highly efficient, and is thus applicable to mass production of the covers.

Figure 8:
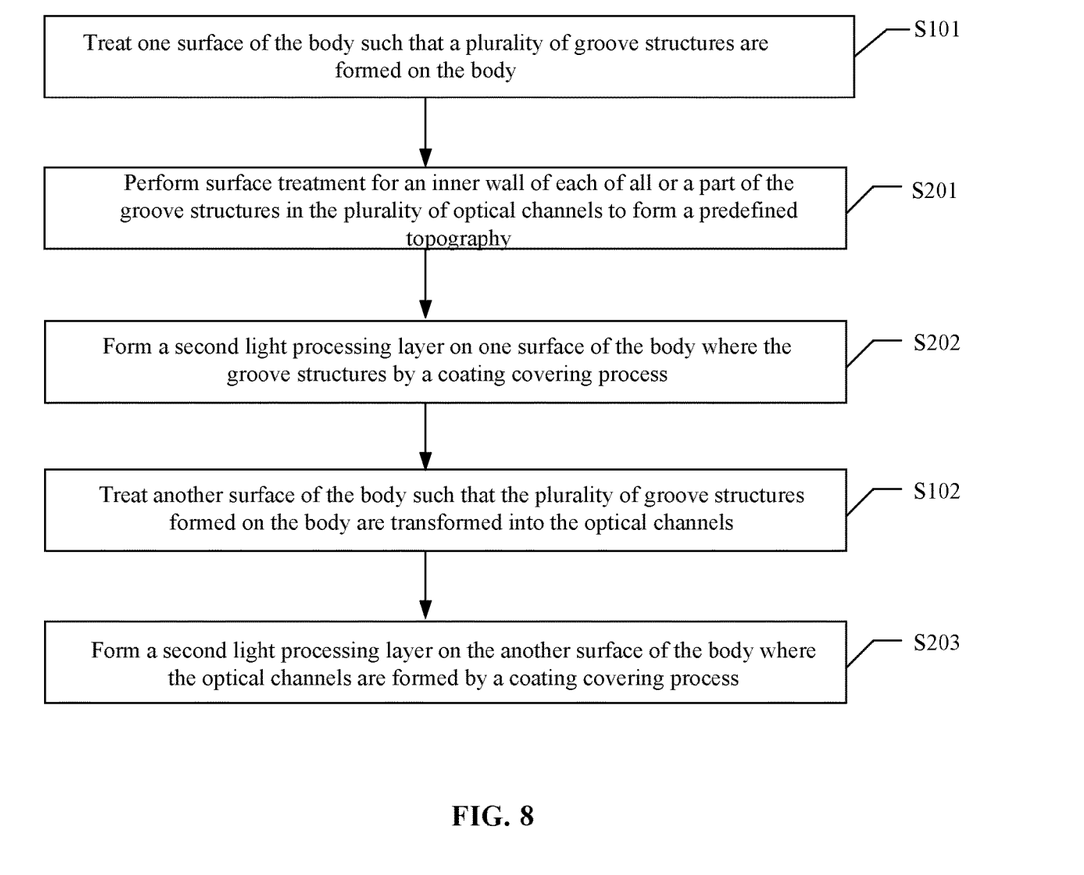
FIG. 8 is a flowchart of a method for fabricating a cover according to another embodiment of the present disclosure.

FIG. 8 is a flowchart of a method for fabricating a cover according to another embodiment of the present disclosure. This embodiment provides further supplementary description for the method for fabricating a cover according to the embodiment as illustrated in FIG. 7. As illustrated in FIG. 8, in the method for fabricating a cover according to this embodiment of the present disclosure:

Upon step S101, the method further includes:

Step S201: Surface treatment is performed for an inner wall of each of all or part of the groove structures in the plurality of optical channels 2 to form a predefined topography.

The inner wall having the predefined topography is configured to diffuse light transmitted to the inner wall, such that the light transmitted to the photosensitive region in the image identification chip 7 is light that is reflected by the object and linearly transmitted along the plurality of optical channels 2.

In another possible implementation, in step S201, surface treatment may also be performed for the inner wall of each of all or part of the groove structures in the plurality of optical channels to form a first light processing layer 5, to achieve an equivalent effect of the predefined topography; nevertheless, after the predefined topography is formed, the first light processing layer 5 may also be formed to modify the surface features of the inner walls of the groove structures, which is not specifically defined in this embodiment.

The first light processing layer 5 is configured to enable the light transmitted onto the photosensitive region in the image identification chip 7 to be light that is reflected by the object and linearly transmitted along the plurality of optical channels 2.

Figure 10:
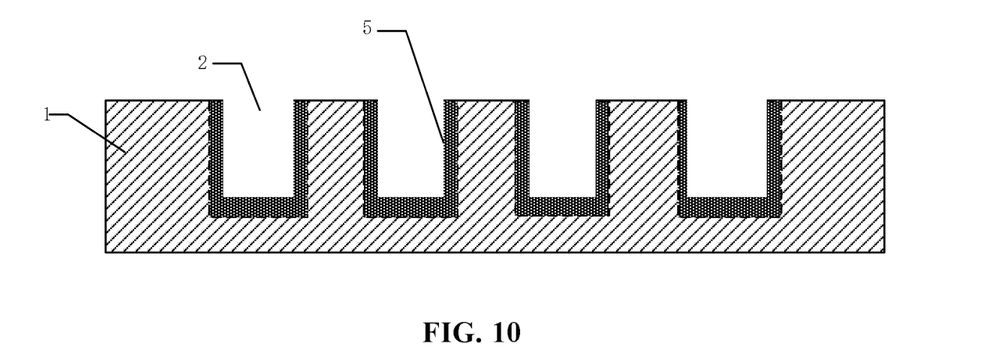
FIG. 10 is a schematic structural view of another exemplary cover according to an embodiment of the present disclosure.

FIG. 10 is a schematic structural view of another exemplary cover according to one embodiment of the present disclosure. Upon the fabrication process in step S201, the structure of the cover is as illustrated in FIG. 10. In the embodiment of the present disclosure, the surface treatment may be performed for the inner walls of the groove structures by virtue of plating, spraying, chemical corrosion and the like process and technique.

Step S202: A second light processing layer 3 is formed on one surface of the body 1 where the groove structures are formed by a coating covering process; wherein the second light processing layer 3 is configured to enable the light transmitted onto the photosensitive region in the image identification chip 7 to be light that is reflected by the object and linearly transmitted along the plurality of optical channels 2.

Figure 11:
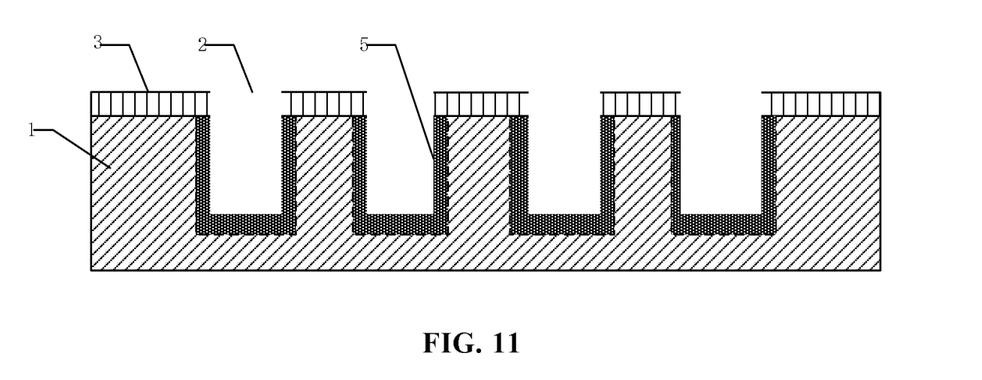
FIG. 11 is a schematic structural view of still another exemplary cover according to an embodiment of the present disclosure.

FIG. 11 is a schematic structural view of still another exemplary cover according to an embodiment of the present disclosure. Upon the fabrication process in step S202, the structure of the cover is as illustrated in FIG. 11. In the embodiment of the present disclosure, the coated second light processing layer has a thickness between 0 μm to 10 μm, inclusive. Nevertheless, the second light processing layer 3 may also be formed by virtue of plating, vapor deposition, silk printing, spraying and the like process.

Further, upon step S102, the method further includes step S203: forming a second light processing layer on the other surface of the body 1 where the optical channels 2 are formed by a coating covering process.

The third light processing layer 4 is configured to enable the light transmitted onto the photosensitive region in the image identification chip 7 to be light that is reflected by the object and linearly transmitted along the plurality of optical channels 2.

Upon the fabrication process in step S203, the structure of the cover is as illustrated in FIG. 6. In the embodiment of the present disclosure, the coated third light processing layer has a thickness between 0 μm to 10 μm, inclusive. Nevertheless, the third light processing layer 4 may also be formed by virtue of plating, vapor deposition, silk printing, spraying and the like processes. It should be noted that in step S202 and step S203, the surface of the body 1 of the cover is treated, and any of the surface treatment methods in step S202 and step S203 may be selected according to the actual conditions to modify the surface features of the body 1 of the cover. Nevertheless, the surface treatment methods in step S202 and step S230 may also be simultaneously employed to modify the surface features of the body 1 of the cover. The sequence of step S202 and step S203 may be determined according to the actual conditions, which is not limited in the embodiment of the present disclosure.

It should be noted that to enable the light reflected by the object and then transmitted to the photosensitive region in the image identification chip 7 to be the light that is linearly transmitted along the plurality of optical channels 2, surface treatment is performed for one or more of the inner walls of the groove surfaces of the optical channels 2, one surface of the body 1 of the cover, and the other surface of the body 1 of the cover to modify the surface features thereof. Nevertheless, the surface treatment methods for modifying the surface feature are not limited to the above listed examples in the embodiment of the present disclosure.

It should be noted that the first light processing layer 5, the second light processing layer 3 and the third light processing layer 4 are all light absorbing layer made from opaque materials. The absorbing layer has a thickness between 1 μm and 10 μm, inclusive. For example, the first light processing layer 5, the second light processing layer 3 and the third light processing layer 4 are all light absorbing layers made from nano composite light absorbing materials, or the first light processing layer 5, the second light processing layer 3 and the third light processing layer 4 are absorbing layers made from deep-color materials, but not limited to these materials.

It should be noted that the first light processing layer 5, the second light processing layer 3 and the third light processing layer 4 are all film layers made from opaque materials. The film layer has a thickness between 1 μm and 10 μm, inclusive. For example, the first light processing layer 5 is any one of a black adhesive layer, a metal layer and a non-metal layer; wherein the metal layer includes one of or any combination of aluminum, aluminum nitride, titanium, titanium nitride, tantalum, tantalum nitride, tungsten, titanium-tungsten alloy, silver and gold; and the non-metal layer includes one of or any combination of silicon oxide, silicon nitride, silicon oxynitride and silicon carbide, which is not limited hereto.

It should be noted that the method for fabricating a cover according to the embodiment of the present disclosure may also be referenced to the relevant content of the cover according to the above embodiments, which is not described herein any further.

In the method for fabricating a cover according to the embodiment of the present disclosure, to the light transmitted to the photosensitive region in the image identification chip 7 to be the light that is reflected by the object and linearly transmitted along the plurality of optical channels 2, surface treatment is performed for one or more of the inner walls of the groove surfaces of the optical channels 2, one surface of the body 1 of the cover, and the other surface of the body 1 of the cover to modify the surface features thereof, such that the interference light from different directions is prevented from being transmitted to the optical channels 1 via the inner walls of the groove surfaces of the optical channels 2, one surface of the body 1 of the cover, and the other surface of the body 1 of the cover. In this way, it is further ensured that the light transmitted to the photosensitive region in the image identification chip 7 is the light that is reflected by the object and linearly transmitted along the plurality of optical channels 2.

An embodiment of the present application further provides an electronic terminal. The electronic terminal includes the above fingerprint identification apparatus.

The structure, functionality and the technical effect of the fingerprint identification apparatus are similar to those disclosed in the above embodiments, which are thus not described herein any further.

The electronic terminal according to the embodiment of the present disclosure includes the fingerprint identification apparatus as described in the above embodiments. By using the cover having the optical channels 2, the image identification chip 7 is capable of receiving the light reflected by the object as much as possible, and hence the signal penetration rate of the fingerprint identification apparatus is improved. In addition, in the fingerprint identification apparatus according to embodiments of the present disclosure, under the condition of satisfying the signal penetration rate, the cover may be as thick as possible, to further enhance the strength and reliability of the cover. As such, the strength and reliability of the electronic terminal are improved.

What the claimed is:

1. A method for fabricating a cover in a fingerprint identification apparatus, the fingerprint identification apparatus comprising an image identification chip and a cover, the cover comprising a body that are through-holes and a plurality of optical channels arranged in the body; the method comprising:
   treating one surface of the body such that a plurality of groove structures are formed as blind holes on the body; and
   treating the other surface of the body such that the plurality of groove structures formed on the body are transformed into the plurality of optical channels; wherein the plurality of optical channels are configured to directly transmit light reflected by an object to be identified to a photosensitive region in the image identification chip to form a biological feature image of the object,
   wherein the treating one surface of the body such that a plurality of groove structures are formed in the body comprises: treating one surface of the body by using an etching, laser or mechanical drilling processes such that the plurality of groove structures are formed in the body, and
   wherein the treating the other surface of the body such that the plurality of groove structures formed in the body are transformed into the optical channels comprises: treating the other surface of the body by using a grinding and thickness-reducing process such that the plurality of groove structures formed in the body are transformed into the optical channels that are through-holes.

2. The method according to claim 1, wherein prior to the treating one surface of the body and upon treating the other surface of the body, the method further comprises: performing surface treatment for an inner wall of all or part of the groove structures in the plurality of optical channels to form a predefined topography; wherein the inner wall having the predefined topography is configured to diffuse light transmitted to the inner wall, such that the light transmitted to the photosensitive region in the image identification chip is light that is reflected by the object and linearly transmitted along the plurality of optical channels.

3. The method according to claim 1, wherein prior to the treating one surface of the body and upon treating the other surface of the body, the method further comprises: performing surface treatment for an inner wall of all or part of the groove structures in the plurality of optical channels to form a first light processing layer; wherein the first light processing layer is configured to enable the light transmitted to the photosensitive region in the image identification chip to be light that is reflected by the object and linearly transmitted along the plurality of optical channels.

4. The method according to claim 1, further comprising: forming a second light processing layer on the one surface of the body where the groove structures are formed by using a coating covering process; wherein the second light processing layer is configured to enable the light transmitted to the photosensitive region in the image identification chip to be light that is reflected by the object and linearly transmitted along the plurality of optical channels.

5. The method according to claim 1, further comprising: forming a third light processing layer on the other surface of the body where the optical channels are formed by a coating covering process; wherein the third light processing layer is configured to enable the light transmitted to the photosensitive region in the image identification chip to be light that is reflected by the object and linearly transmitted along the plurality of optical channels.

6. The method according to claim 1, further comprising: forming a predefined included angle between a central line of the plurality of optical channels and a longitudinal central line of the photosensitive region in the image identification chip, wherein the longitudinal central line of the photosensitive region is vertical to an installation surface of the image identification chip.

7. The method according to claim 1 further comprising: coating a bonding layer on an installation surface of the image identification chip, wherein a lower surface of the cover is bonded to the installation surface of the image identification chip via the bonding layer.

8. The method according to claim 7, wherein the bonding layer has a hollowed structure; wherein hollowed holes of the hollowed structure coincide with the optical channels and coincide with the photosensitive region in the image identification chip.

* * * * *